US007151215B2

(12) United States Patent
Hsieh

(10) Patent No.: US 7,151,215 B2
(45) Date of Patent: Dec. 19, 2006

(54) WAVEFORM ADJUSTING SYSTEM FOR MUSIC FILE

(75) Inventor: Yu-Cheng Hsieh, Hsin-Chu (TW)

(73) Assignee: Mediatek Inc., Hsin-Chu (TW)

( * ) Notice: Subject to any disclaimer, the term of this patent is extended or adjusted under 35 U.S.C. 154(b) by 74 days.

(21) Appl. No.: 10/833,148

(22) Filed: Apr. 28, 2004

(65) Prior Publication Data

US 2004/0211309 A1 Oct. 28, 2004

(30) Foreign Application Priority Data

Apr. 28, 2003 (TW) .............................. 92109945 A

(51) Int. Cl.
*G10H 7/00* (2006.01)

(52) U.S. Cl. ............................. 84/603; 84/604; 84/605

(58) Field of Classification Search .................. 84/603, 84/604, 633, 1, 605
See application file for complete search history.

(56) References Cited

U.S. PATENT DOCUMENTS

| | | | | |
|---|---|---|---|---|
| 4,214,503 | A | 7/1980 | Deutsch | 84/1.27 |
| 5,789,690 | A | 8/1998 | Furuhashi | 84/633 |
| 5,880,387 | A | 3/1999 | Kim | 84/604 |
| 6,201,175 | B1 * | 3/2001 | Kikumoto et al. | 84/605 |
| 6,365,817 | B1 * | 4/2002 | Suzuki et al. | 84/603 |
| 6,534,700 | B1 | 3/2003 | Cliff | 84/603 |
| 6,759,585 | B1 | 7/2004 | Hatanaka | 84/633 |
| 2003/0150319 | A1 * | 8/2003 | Nishimoto | 84/603 |

OTHER PUBLICATIONS

Google Search: "define: amplitude", ©2005 Google, http://www.google.com/search?hl=en&lr=&rls=GGLD%2CGGLD%3A2004-30%2CGGLD%3Aen&q=define%3A+amplitude.*

Google Search: "define: scale factor", ©2005 Google, http://www.google.com/search?hl=en&lr=GGLD%2CGGLD%3A2004-30%2CGGLD%3Aen&q=define%3A+scale+factor.*

* cited by examiner

*Primary Examiner*—Lincoln Donovan
*Assistant Examiner*—Christina Russell
(74) *Attorney, Agent, or Firm*—Troxell Law Office, PLLC

(57) ABSTRACT

A waveform adjusting system for a music file suitable in hand held devices is described. A music file includes a plurality of tones, and the waveform adjusting system includes a maximum magnitude estimating module and an adjusting module. The waveform adjusting system is capable of analyzing the whole music file, superposing the magnitudes of all the tones, and calculating a scale factor according to the maximum superposed magnitude and a predetermined level. The adjusting module multiplies the magnitude of each tone by the scale factor K, thus the volume of the music is kept to a suitable level without suffering from too small volume problem or signal distortion due to too large volume.

10 Claims, 6 Drawing Sheets

Receiving a music file — 60

Acquiring an overall waveform — 62

Estimating a value of maximum amplitude — 64

Generating a scale factor — 66

Adjusting the overall waveform — 68

WAVEFORM ADJUSTING SYSTEM FOR MUSIC FILE

BACKGROUND OF THE INVENTION

1. Field of the Invention

This present invention relates to a waveform adjusting system, particularly to a waveform adjusting system for adjusting the magnitude of an overall waveform corresponding to a music file.

2. Description of the Prior Art

With regard to hand-held devices (such as mobile phone, personal digital assistant, etc), the output volume range of the music or sound effect is usually limited and has its upper bound limitation. Referring to FIG. 1, a schematic diagram shows the functional blocks of a music synthesizer used in a hand-held device in the prior art. Conventionally, a music synthesizer 10 is a module having a music file database 11, a music file decoder 12, a tone generator 14, a tone generator 14, a D/A converter 16 and an amplifier 18. The traditional method for processing the music file (such as a MIDI music file) in a hand-held device utilizes the music file decoder 12 to decode a music file 13 into a series of tones. Each tone is represented by a set of tone data 121 including, as an example, the pitch, the duration, the magnitude, and the type of the tone. Different types of tones correspond to different kinds of musical instruments, thus have different kinds of corresponding waveforms. The music file decoder 12 transmits these tone data to the tone generator 14. The tone generator 14 generates a PCM signal 15 based on the received tone data as well as the waveform corresponding to the tone. The D/A converter 16 transfers the PCM signal 15 to an analog signal 17 which is further amplified by the amplifier 18 to drive the speaker 19. The magnitude of each tone in the music file and the maximum number of overlapped tones (also known as "polyphony") in the music will affect the output volume when the music file is executed and played. In other words, if the amplification ratio of the amplifier 18 in the output circuit is fixed, the magnitude of the overall waveform (the waveform generated by synthesizing all the tones in the music file 13) output from the tone generator 14 will also affect the ultimate output volume. The output circuit here means the circuit set after the D/A converter 16. As shown in FIG. 1; the output circuit includes the amplifier 18 and the speaker 19.

Referring to FIG. 2, it shows an overall waveform 22 corresponding to a first music file and an overall waveform 24 corresponding to a second music file. In this example, the first music file comprises fewer polyphonies and/or the tones in the first music file have small magnitude. The magnitude of the overall waveform 22 outputted from the tone generator 14 might be too small to be suitable for alert ringing purpose, and the input dynamic range 26 of the D/A converter 16 is not fully utilized.

On the other hand, the second music file comprises more polyphonies and/or the tones in the second music file have higher magnitude, the magnitude of the overall waveform 24 outputted from the tone generator 14 might become too high to exceed the input dynamic range 26 of the D/A converter 16, and thus leads to undesirable signal distortion.

SUMMARY OF THE INVENTION

An objective of the present invention is to provide a waveform adjusting system for adjusting the magnitude of an overall waveform of a music file. The present invention appropriately adjusts the magnitude of the overall waveform of the music file and keeps it within the input dynamic range of the output circuit to keep the volume of the music around a suitable level no matter what kind of music file to be played.

The waveform adjusting system, according to the present invention, comprises a magnitude estimating module and an adjusting module. The magnitude estimating module estimates the maximum magnitude of the overall waveform of the music file. The adjusting module is used to adjust the magnitude of each tone in the music file according to a scale factor which is calculated based on the maximum magnitude of the overall waveform and a default level. By this way, the waveform adjusting system according to the present invention keeps the magnitude of the overall waveform of the music file within the input dynamic range of the output circuit so as to keep the volume of the music around a suitable level no matter what kind of music file to be played.

After receiving and decoding a music file, the present invention estimates the maximum magnitude of the overall waveform of the music file. A scale factor is calculated based on the maximum magnitude and a predetermined default level. The magnitude of each tone in the music file is then multiplied by the scale factor. By this way, the method described above keeps the overall waveform such that the volume of the music around a suitable level no matter what kind of music file to be played The advantage and spirit, according to the present invention, may be understood by the following recitations together with the appended drawings.

BRIEF DESCRIPTION OF THE APPENDED DRAWINGS

DETAILED DESCRIPTION OF THE INVENTION

The present invention is a kind of waveform adjusting system in the audio synthesizer. It is used to adjust the magnitude of the overall waveform corresponding to a music file. No matter what music file the hand-held device is playing, the waveform adjusting system can substantially keep the volume of the music around a suitable level without suffering from too small volume problem or signal distortion due to too large volume.

Figure 1:
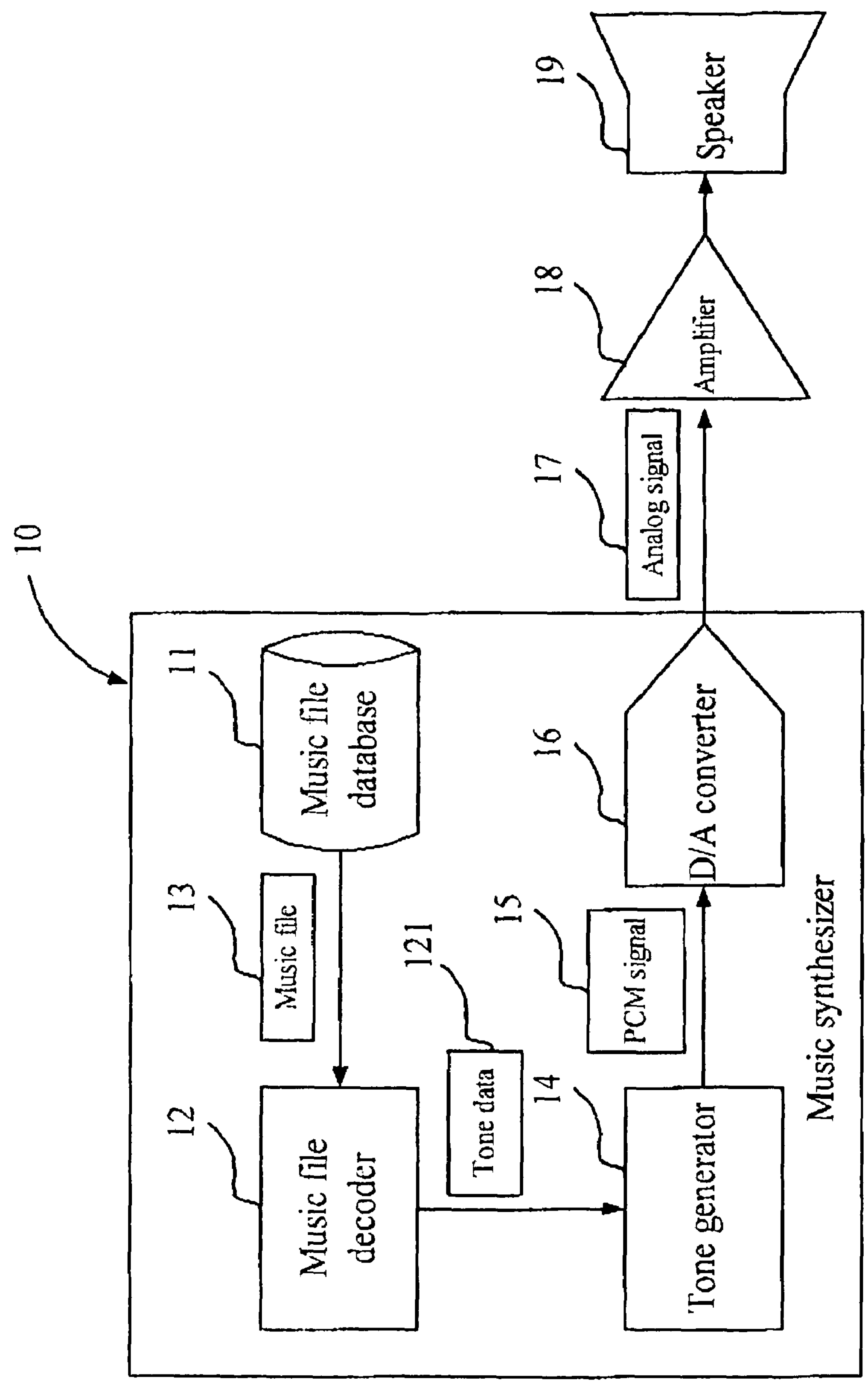
FIG. 1 is a schematic diagram that shows the functional blocks of a music synthesizer used in a hand-held device in the prior art.
Figure 2:
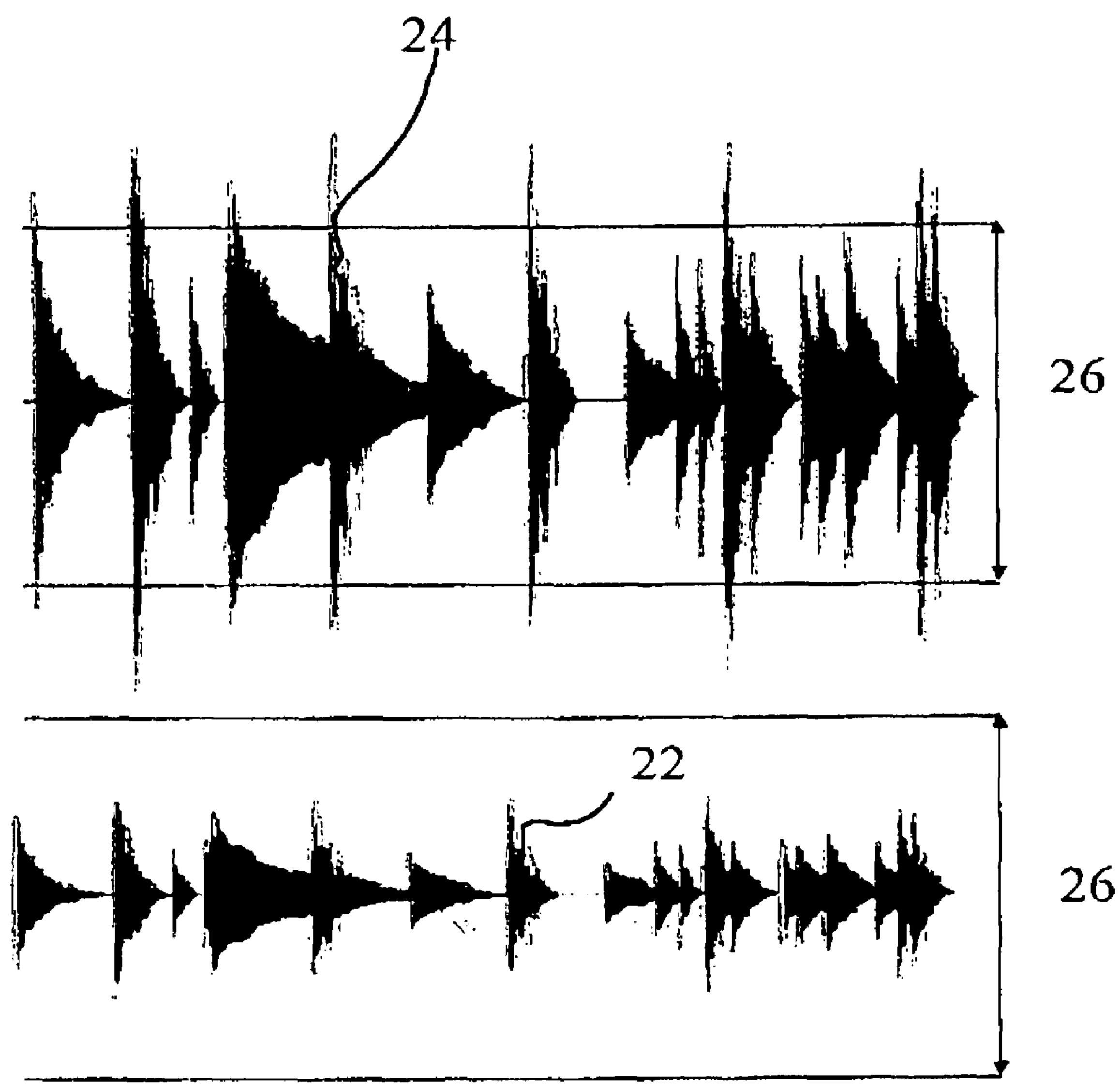
FIG. 2 shows two overall waveforms respectively corresponding to two music files.
Figure 3:
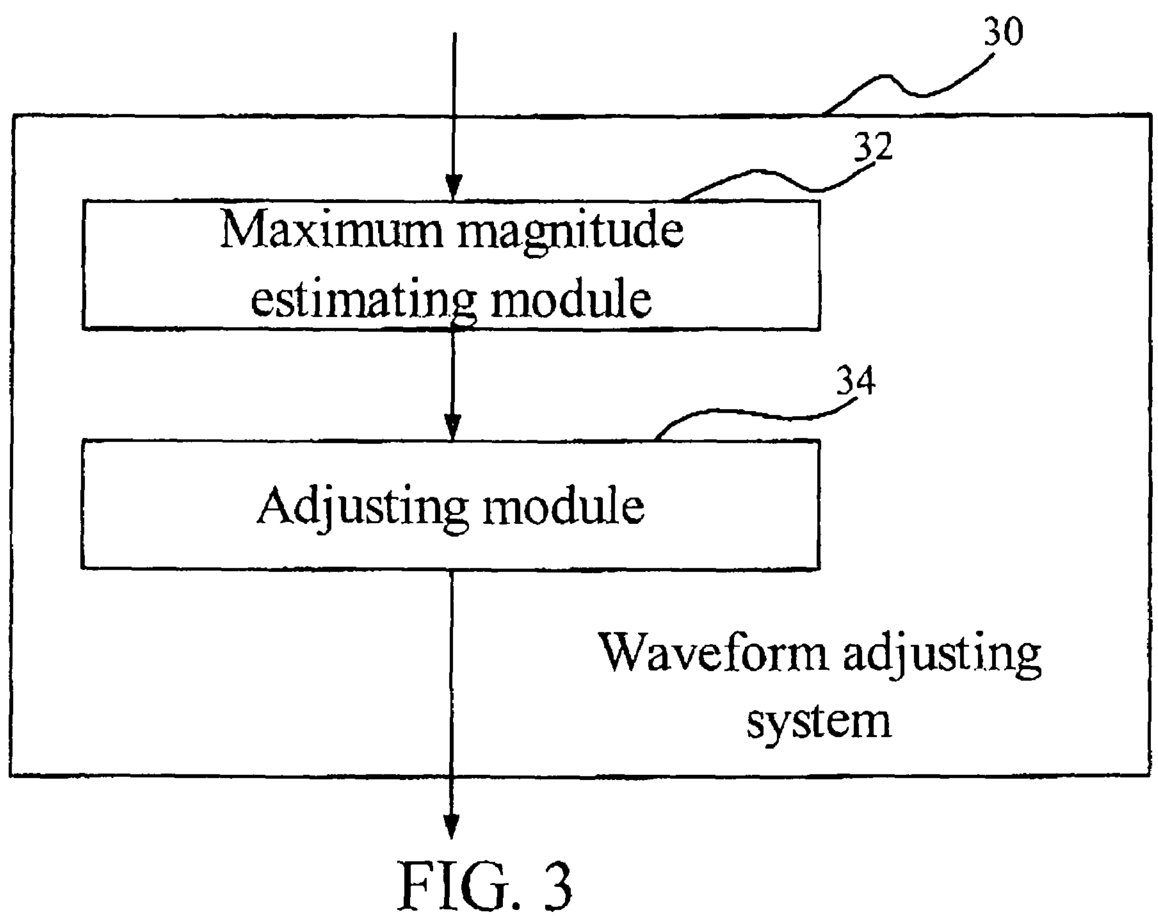
FIG. 3 is a schematic diagram that shows the waveform adjusting system according to the present invention.

Referring to FIG. 3, it is a schematic diagram of the waveform adjusting system 30 according to the present invention. In the present invention, the waveform adjusting system 30 comprises a maximum magnitude estimating module 32 and an adjusting module 34. The maximum magnitude estimating module 32 is used to estimate the maximum magnitude $L_M$ of the overall waveform corresponding to a music file to be played. Each music file comprises a series of tones, and each type of tone has an individual waveform associated with a magnitude curve. After the music file 13 is transmitted to the music file decoder 12, the music file decoder 12 decodes the music file 13 and obtains a series of tone data wherein each tone data contains, as an example, the initial time, pitch, duration, magnitude, timbre, and type of the tone.

Figure 4:
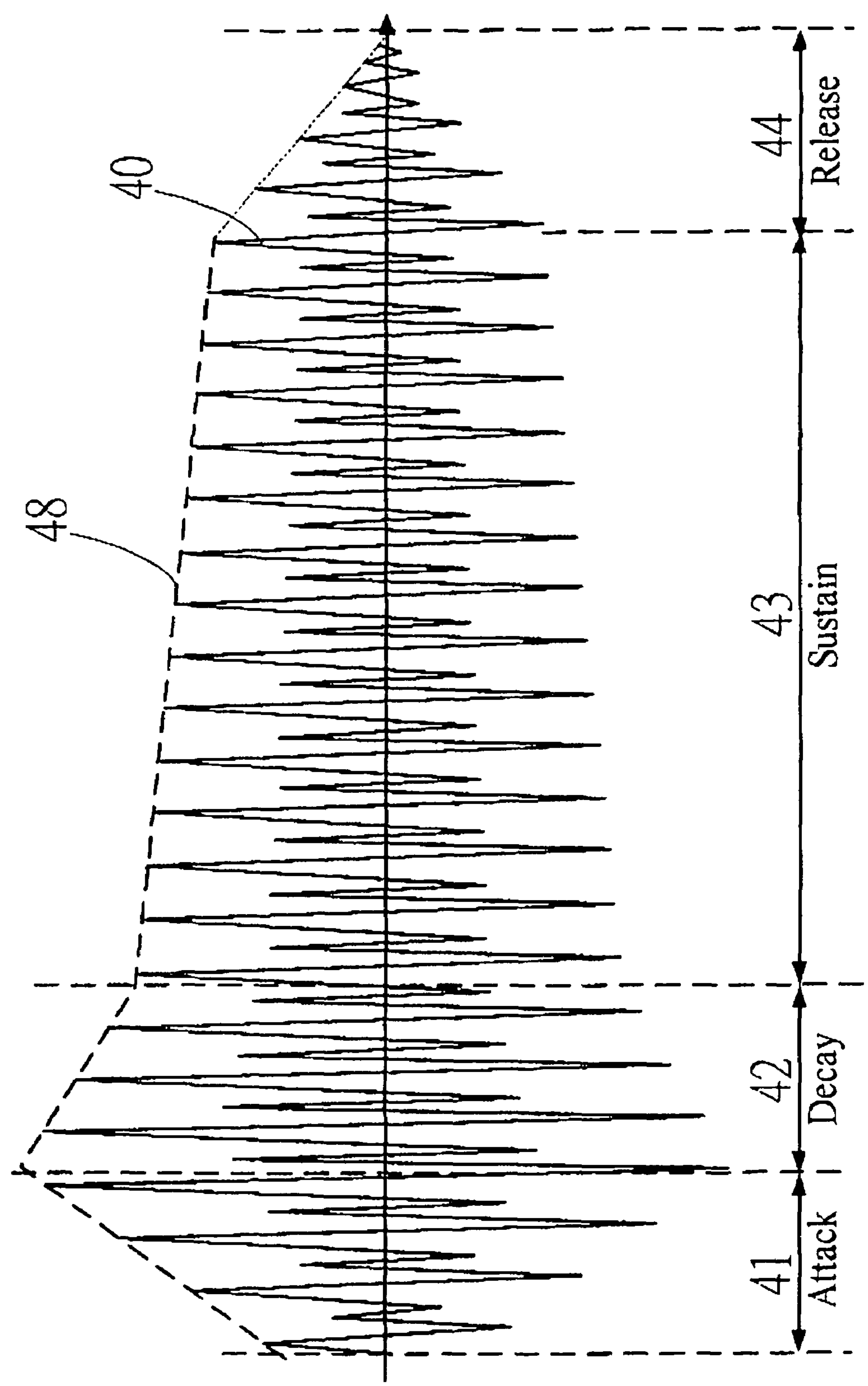
FIG. 4 is a schematic diagram that shows a waveform of a tone type.

Referring to FIG. 4, it is a schematic diagram that shows a waveform 40 corresponding to a tone type wherein the dotted line represents the magnitude curve 48 of the waveform 40. There are many ways to describe the magnitude curve of a waveform. Basically, as well know to those skilled in the art, the magnitude curve of a waveform can be described by a set of envelope characteristic parameters such as the well known ADSR parameters. Taking ADSR parameters as an example, the magnitude curve 48 of the waveform 40 is divided into four phases called Attack 41, Delay 42, Sustain 43, and Release 44 as shown in FIG. 4. The magnitude curve during each phase is described by one or more characteristic values, e.g. the slop of the magnitude curve, the level of the magnitude curve, etc. And these characteristic values associated with these phases are together regarded as the ADSR parameters. Each type of tone has its own corresponding ADSR parameters, or in general, the envelope characteristic parameters. The envelope characteristic parameters of each tone type are usually stored in the system memory in advance.

Based on the tone data generated by the music file decoder 12 as well as the envelope characteristic parameters corresponding to the tone type, the maximum magnitude estimating module 32 is capable of estimating the magnitude of the waveform corresponding to the tone at any time point.

Figure 5:
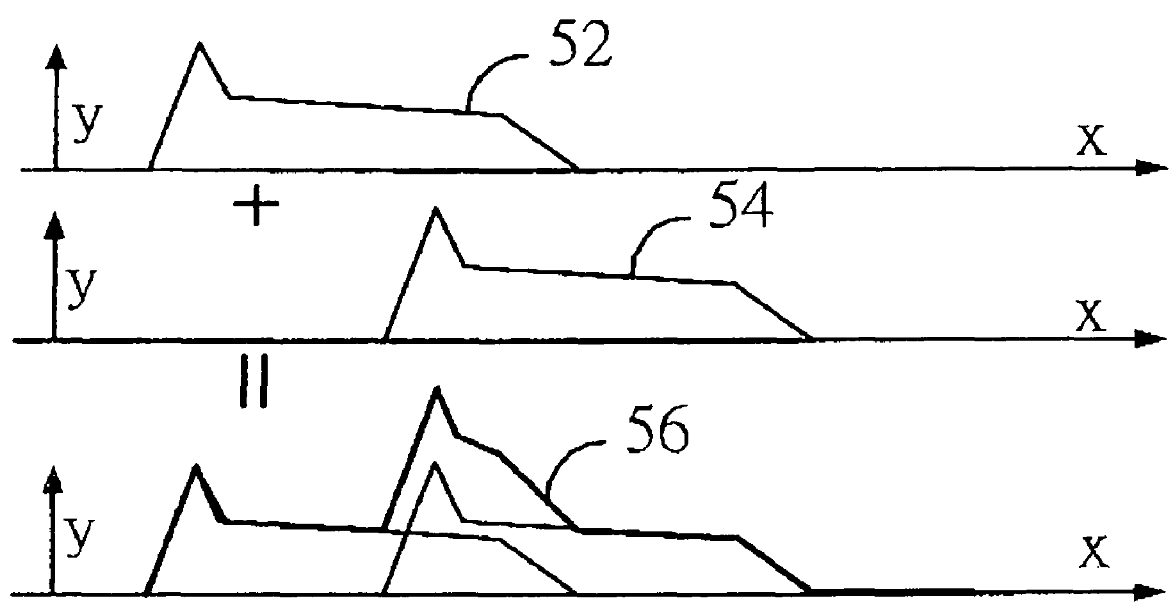
FIG. 5 is a schematic diagram that shows the magnitude curve of the waveform corresponding to the superposed consecutive tones.

Please refer to FIG. 5 which is a schematic diagram that shows the magnitude curve of the waveform corresponding to the superposed consecutive tones. The x-coordinate indicates the time line, and the y-coordinate indicates the magnitude. The overall waveform of a music file is obtained by superposing a series of waveforms of the tones. In FIG. 5, two magnitude curves 52 and 54 respectively corresponding to the waveforms of two tones were taken as an example for illustrating the present invention. In FIG. 5, the magnitude curve 52 corresponds to a first tone, while the magnitude curve 54 corresponds to a second tone. The magnitude curve of each tone is calculated based on the envelope characteristic parameters. In FIG. 5, when the waveform of the first tone superposes the waveform of the second tone, it is found that the magnitude curve 56 of the superposed waveform can be well approximated by superposing the magnitude curves 52 and 54. As can be seen in FIG. 5, the maximum magnitude $L_M$ appears around the end of the Attack phase of the magnitude curve 54. By this way, according to one embodiment of the present invention, after all the waveforms of tones are superposed, the maximum magnitude estimating module 32 analyzes the overall magnitude curve corresponding to the music file to obtain a maximum magnitude value $L_M$.

In another preferred exemplary embodiment, the magnitude curve of each tone type is sampled and saved as a magnitude table in advance. The maximum magnitude estimating module 32 according to the present invention then obtains the magnitude of the waveform of each tone at each specified time point based on looking up the magnitude table, computes the magnitude of the superposed waveforms, and finally finds out the value of maximum magnitude $L_M$ of the overall waveform corresponding to the music file.

Referring to FIG. 3 again, after the maximum magnitude estimating module 32 obtains the value of maximum magnitude $L_M$ of the overall waveform corresponding to the music file, the adjusting module 34 performs adjusting the magnitude of the overall waveform to a suitable level. The adjusting module 34 has a predetermined default level $L_0$, and the default level $L_0$ is well chosen such that the input dynamic range 26 of the D/A converter 16 can be well utilized as well as can avoid the signal distortion due to too large magnitude. The adjusting module 34 is used to adjust the magnitude of each tone in the music file according to a scale factor K which is calculated based on the default level $L_0$ and the maximum magnitude $L_M$ of the overall waveform.

In a preferred exemplary embodiment of the present invention, the scale factor K is calculated by:

$$\text{scale factor } K - L_0/L_M \tag{1}$$

Based on the scale factor K by Eq. (1), all the magnitudes of the waveforms of the tones in the music file are multiplied by the obtained scale factor K such that the maximum magnitude outputted from the tone generator 14 to the D/A converter 16 will be substantially the default level $L_0$. Note that the adjusting module 34 multiplies the magnitude of each tone by the same scale factor K, thus achieves a uniformly scaling of the volume of the music to be played.

Figure 6:
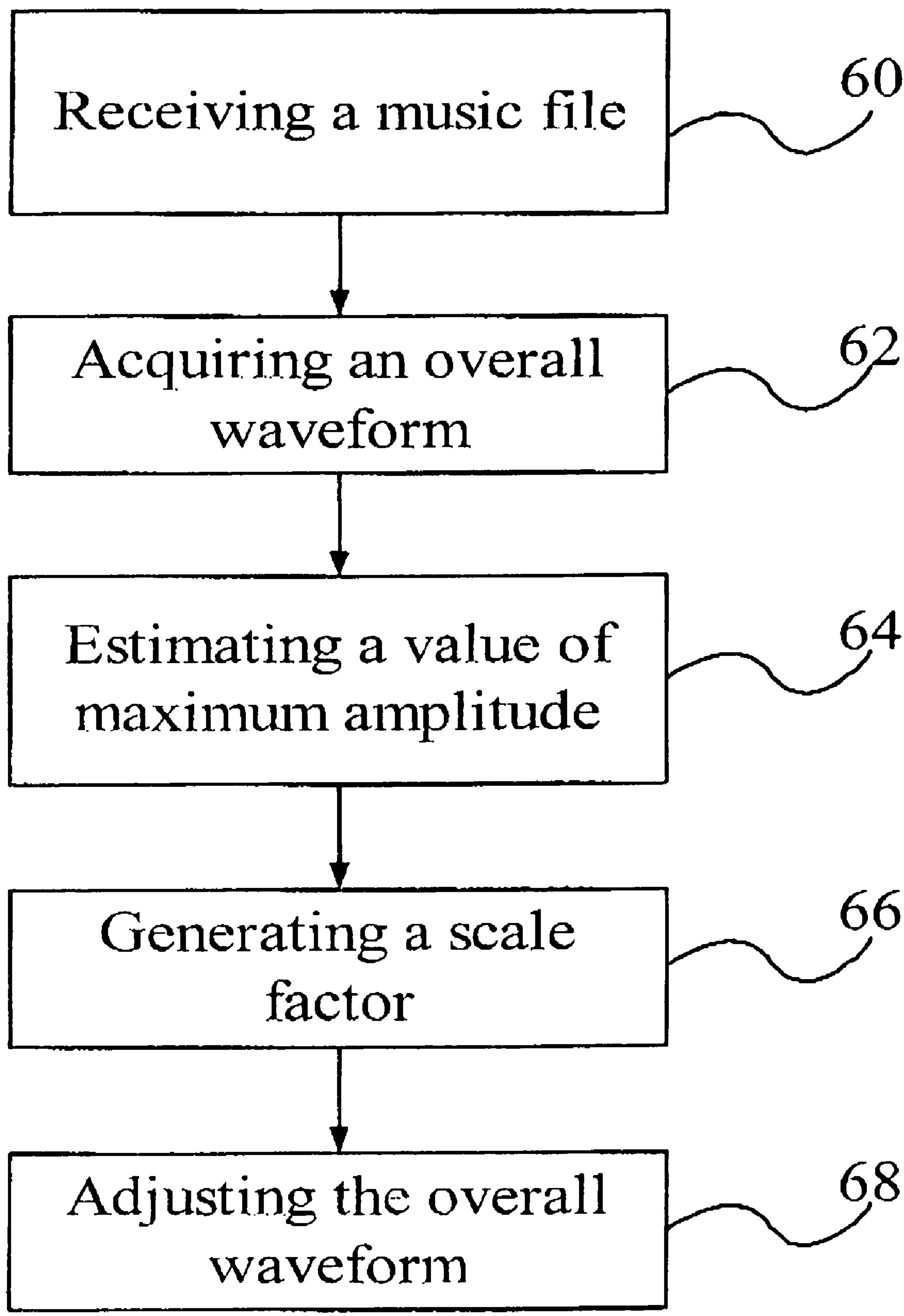
FIG. 6 is a flow chart that shows the waveform adjusting method according to the present invention.

FIG. 6 is a flow chart that shows the waveform adjusting method according to the present invention. The waveform adjusting method according to the present invention includes the following steps:

Step 60: receiving a music file and decoding it to obtain a series of tone data.

Step 62: acquiring the overall waveform corresponding to the music file.

Step 64: estimating the maximum magnitude $L_M$ of the overall waveform corresponding to the music file.

Step 66: generating a scale factor K based on the maximum magnitude $L_M$ and a predetermined default level $L_0$.

Step 68: adjusting the magnitude of each tone in the music file according to the scale factor K.

Therefore, the present invention analyzes the music file to be played, finds out the maximum magnitude $L_M$, and calculates a scale factor K for scaling the volume of the music to a suitable level. By this way, the problem of too small volume or signal distortion due to too large volume is avoided.

With the example and explanations above, the features and spirits of the invention will be hopefully well described. Those skilled in the art will readily observe that numerous modifications and alterations of the device may be made while retaining the teaching of the invention. Accordingly, the above disclosure should be construed as limited only by the metes and bounds of the appended claims.

What is claimed is:

1. A waveform adjusting system for adjusting a magnitude of an overall waveform corresponding to a music file, said music file comprising a series of tones, said tone having a tone type, said tone type having a corresponding waveform, said waveform of said tone type associating with a magnitude curve, the overall waveform being generated by synthesizing said series of tones in the music file, said waveform adjusting system comprising:

- a maximum magnitude estimating module for estimating a maximum magnitude of said overall waveform; and
- an adjusting module for
  - calculating a scale factor based on said maximum magnitude and a predetermined level; and adjusting said magnitude of said overall waveform based on said scale factor when synthesizing said series of tones of said music file to generate said overall waveform.

2. The waveform adjusting system of claim 1, wherein said scale factor is obtained based on a ratio of said predetermined level and said maximum magnitude.

3. The waveform adjusting system of claim 1, wherein said adjusting module adjusts said magnitude of said overall waveform by multiplying a magnitude of each said tone by said scale factor.

4. The waveform adjusting system of claim 1, wherein said maximum magnitude estimating module obtains said magnitude curve of said waveform of said tone according to a plurality of envelope characteristic parameters associated with said tone, and obtains a magnitude curve of said overall waveform by superposing said magnitude curve of each said tone, and outputs a maximum value of said magnitude curve as the maximum magnitude of said overall waveform.

5. The waveform adjusting system of claim 1, wherein said maximum magnitude estimating module obtains said magnitude curve of said waveform of said tone based on magnitude curve table, and obtains a magnitude curve of said overall waveform by superposing said magnitude curve of each said tone, and outputs a maximum value of said magnitude curve as the maximum magnitude of said overall waveform.

6. A waveform adjusting method for adjusting a magnitude of an overall waveform corresponding to a music file, said music file comprising a series of tones, said tone having a tone type, said tone type having a corresponding waveform, said waveform of said tone type associating with a magnitude curve, the overall waveform being generated by synthesizing said series of tones in the music file said waveform adjusting method comprising the following steps of:

estimating a maximum magnitude of said overall waveform;

calculating a scale factor based on said maximum magnitude and a predetermined level; and adjusting said waveform magnitude of said overall waveform based on said scale factor when synthesizing said series of tones of said music file to generate said overall waveform.

7. The waveform adjusting method of claim 6, wherein said scale factor is obtained based on a ratio of said predetermined level and said maximum magnitude.

8. The waveform adjusting method of claim 6, wherein said adjusting step is to multiply the magnitude of each said tone by said scale factor.

9. The waveform adjusting method of claim 6, wherein said estimating step obtains said magnitude curve of said waveform of said tone according to a plurality of envelope characteristic parameters associated with said tone, and obtains a magnitude curve of said overall waveform by superposing said magnitude curve of each said tone, and outputs a maximum value of said magnitude curve as the maximum magnitude of said overall waveform.

10. The waveform adjusting system of claim 1, wherein said estimating step obtains said magnitude curve of said waveform of said tone based on magnitude curve table, and obtains a magnitude curve of said overall waveform by superposing said magnitude curve of each said tone, and outputs a maximum value of said magnitude curve as the maximum magnitude of said overall waveform.

* * * * *